(12) United States Patent
Nobbe et al.

(10) Patent No.: US 6,452,445 B1
(45) Date of Patent: Sep. 17, 2002

(54) VOLTAGE CONTROLLED VARIABLE GAIN ELEMENT

(75) Inventors: Dan Nobbe, Crystal Lake; Arul M. Balasubramaniyan, Round Lake, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/594,988

(22) Filed: Jun. 15, 2000

(51) Int. Cl.[7] .............................. G06G 7/26; G06G 7/12
(52) U.S. Cl. ......................................... 327/563; 330/254
(58) Field of Search ......................... 327/359, 563, 327/52; 455/326, 333; 330/252, 253, 254

(56) References Cited

U.S. PATENT DOCUMENTS

| | | | |
|---|---|---|---|
| 3,581,222 A | 5/1971 | Dunwoodie | 330/284 |
| 3,663,900 A | 5/1972 | Peterson | 333/81 R |
| 4,155,047 A | 5/1979 | Rubens et al. | 330/284 |
| 4,169,247 A * | 9/1979 | Watanabe et al. | 330/254 |
| 4,230,953 A * | 10/1980 | Wilcox | 327/518 |
| 4,334,195 A | 6/1982 | Luce | 327/308 |
| 4,456,886 A | 6/1984 | Nishioka et al. | 330/254 |
| 5,256,984 A * | 10/1993 | Lee | 330/254 |
| 5,387,877 A | 2/1995 | Robinson | 330/254 |
| 5,565,823 A | 10/1996 | Fratti | 333/81 R |
| 5,586,146 A | 12/1996 | Fang et al. | 375/295 |
| 5,812,008 A | 9/1998 | Nigel | 327/350 |
| 5,818,300 A * | 10/1998 | Hirano | 330/252 |
| 5,859,674 A * | 1/1999 | Chevallier | 348/731 |
| 5,920,205 A * | 7/1999 | Bushehri | 326/115 |
| 5,933,771 A * | 8/1999 | Tiller et al. | 455/333 |
| 6,169,452 B1 * | 1/2001 | Popescu et al. | 327/359 |
| 6,205,325 B1 * | 3/2001 | Groe | 455/333 |

* cited by examiner

*Primary Examiner*—Terry D. Cunningham
*Assistant Examiner*—Quan Tra
(74) *Attorney, Agent, or Firm*—Paul J. Bartusiak; Randall S. Vaas

(57) ABSTRACT

A variable gain element for adjusting a magnitude of an input signal. The variable gain element includes a first differential transistor pair having a first transistor coupled to a second transistor. A second differential transistor pair couples the second transistor to a supply voltage and to an output terminal of the first transistor. A load resistor couples the output terminal to the supply voltage. A control voltage applied to an input of the second differential pair causes a varying amount of current cancellation through the load resistor.

9 Claims, 3 Drawing Sheets

— PRIOR ART —

VOLTAGE CONTROLLED VARIABLE GAIN ELEMENT

FIELD OF THE INVENTION

This invention generally relates to variable gain circuitry. More specifically, this invention relates to a variable gain element for adjusting an amplitude of an input signal.

BACKGROUND OF THE INVENTION

Cellular telephone usage has continued to increase in popularity. Cellular telephone manufacturers constantly strive to improve the performance of their products to gain market share. Specifically, manufacturers try to minimize the energy necessary to power the cellular telephone; this reduces battery drain and thus increases the available talk time of a cellular telephone on a single battery charge. Talk time is a critical performance specification that consumers use to compare various cellular telephones on the market.

Manufacturers are also constantly striving to improve the appearance of their products. Thus, manufacturers are always looking for ways to reduce the size of the cellular phones because consumers desire cellular telephones that are small and easy to carry.

Yet another design goal is to minimize the cost of the cellular telephone. A manufacturer can gain a significant competitive advantage if it can design a functioning cellular telephone at a low cost.

To meet the needs of minimizing battery drain, reducing the size of cellular telephones, and minimizing the manufacturing cost, more and more of the electrical circuit functions are accomplished through the use of integrated circuit technology.

Much of the functionality of the cellular telephone transceiver are embedded in integrated circuits. One key circuit block of both the receiver and the transmitter is a variable gain element. This can be in the form of a variable gain amplifier and/or variable gain attenuator.

For example, in a conventional cellular telephone transmitter, at least one variable gain element is needed to vary the transmitted output power in accordance with the cellular telephone standard. A cellular telephone that is close to a base station does not have to transmit as much power as a cellular telephone further away from the base station.

FIG. 1 shows a prior art variable gain element 10 suitable for integrated circuit technology. In any particular transmitter or receiver, the variable gain element 10 can be used at a radio frequency (RF), at an intermediate frequency (IF), or both.

At the core if variable gain element 10 is a pair of emitter coupled transistors, Q1 and Q2. A differential signal input is applied to input ports 18 and 20. A DC current source 16 couples the emitters of Q1 and Q2 to ground.

The collectors of Q1 and Q2 are each connected to emitter coupled differential pairs. For example, in the collector of Q1 there is an emitter coupled pair Q3 and Q4, and in the collector of Q2 there is an emitter coupled pair Q5 and Q6. The base terminals of Q4 and Q5 are connected together at port 32, where a DC reference voltage is applied. The base terminals of Q3 and Q6 are connected together at control port 30, where a DC control voltage is applied. The collector terminals of Q3, Q4, Q5, and Q6 are each coupled to supply voltage 36 through separate resistors. The attenuated or amplified signal is coupled from the collector of Q3 at output port 34. If a differential output is desired, the complementary output signal can be coupled from the collector of Q6.

In operation, the differential input signal is applied to input ports 18 and 20. The gain of the Q1/Q2 differential pair is related to $g_m$*R as is known in the art. However, the $g_m$ here is manipulated by steering current away from load resistor 40 to decrease the gain (e.g. attenuate) or to load resistor 40 to increase the gain. This current steering is accomplished by altering the DC control voltage applied to control port 30. For example, as the DC control voltage increases above the DC reference voltage at port 32, the gain increases and the output signal increases in magnitude. Conversely, as the DC control voltage decreases below the DC reference voltage at port 32, the gain decreases and the output signal appearing at output port 34 decreases in magnitude.

The variable gain element 10 has several drawbacks. First, the noise performance varies as a function of gain. For example, at maximum gain (Vcntl>Vbias), transistors Q3 and Q6 are fully on, while Q4 and Q5 are essentially turned off. As the attenuation gain is decreased by about 6 dB (e.g. Vcntl reduced), transistors Q3, Q4, Q5, and Q6 are all conducting and thus contribute to the overall noise performance of the variable gain element 10. As the gain if further decreased to a minimum gain (e.g. Vcntl lowered below Vbias), only transistors Q4 and Q5 are conducting, and the noise power drops. Thus, there is a peaking in the noise power produced from the variable gain element 10.

A second drawback relates to the intermodulation performance of the variable gain element. The intermodulation components of the variable gain element 10 peak at about a 6 dB cutback in the gain, and this degradation in the intermodulation performance degrades the overall performance of the transceiver. Thus, there is a need for a variable gain element suitable for integrated circuit implementation that has improved noise and intermodulation performance.

DETAILED DESCRIPTION OF PREFERRED EMBODIMENTS

Figure 1:
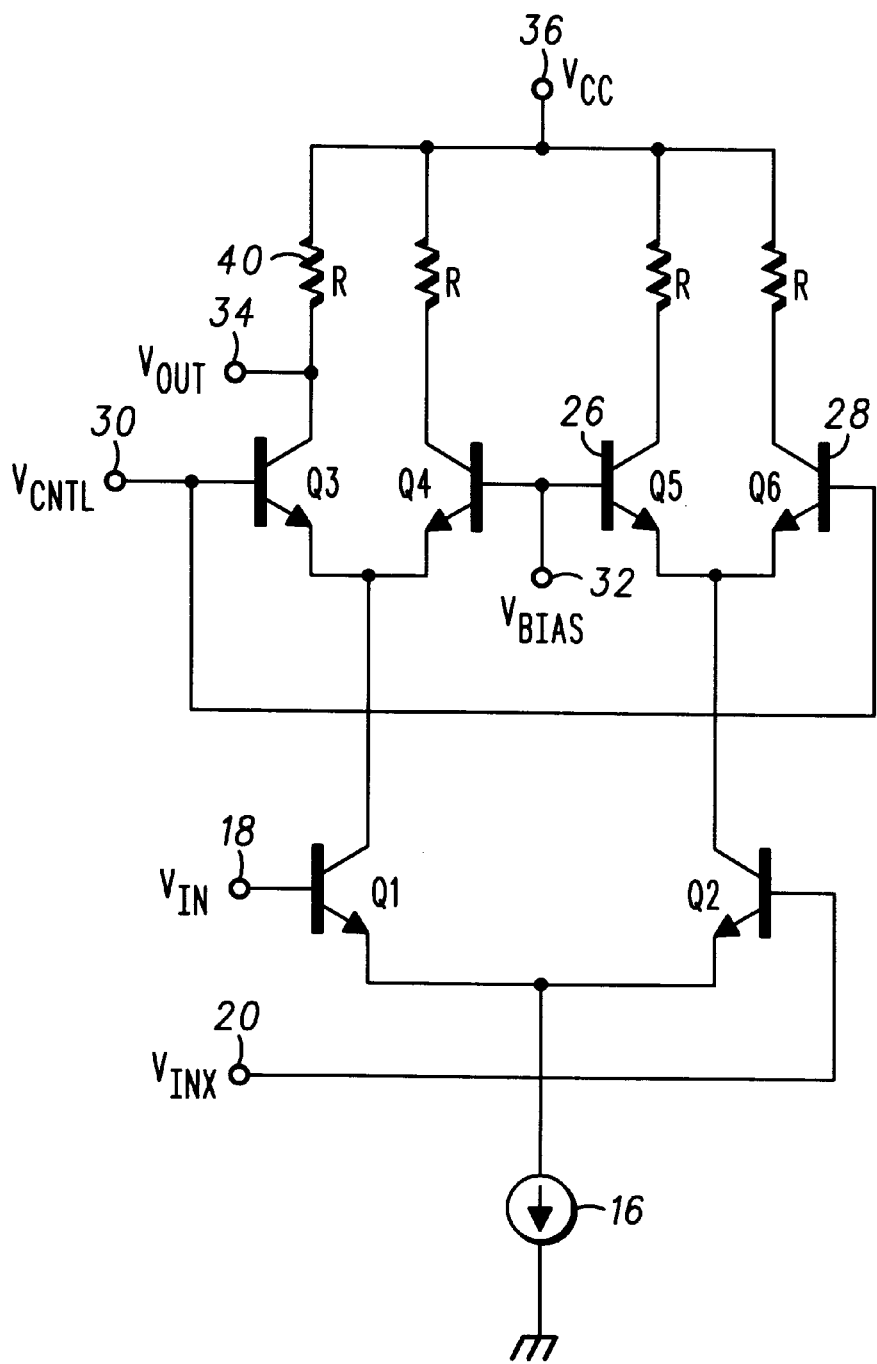
FIG. 1 is a prior art circuit diagram of a variable gain element.
Figure 2:
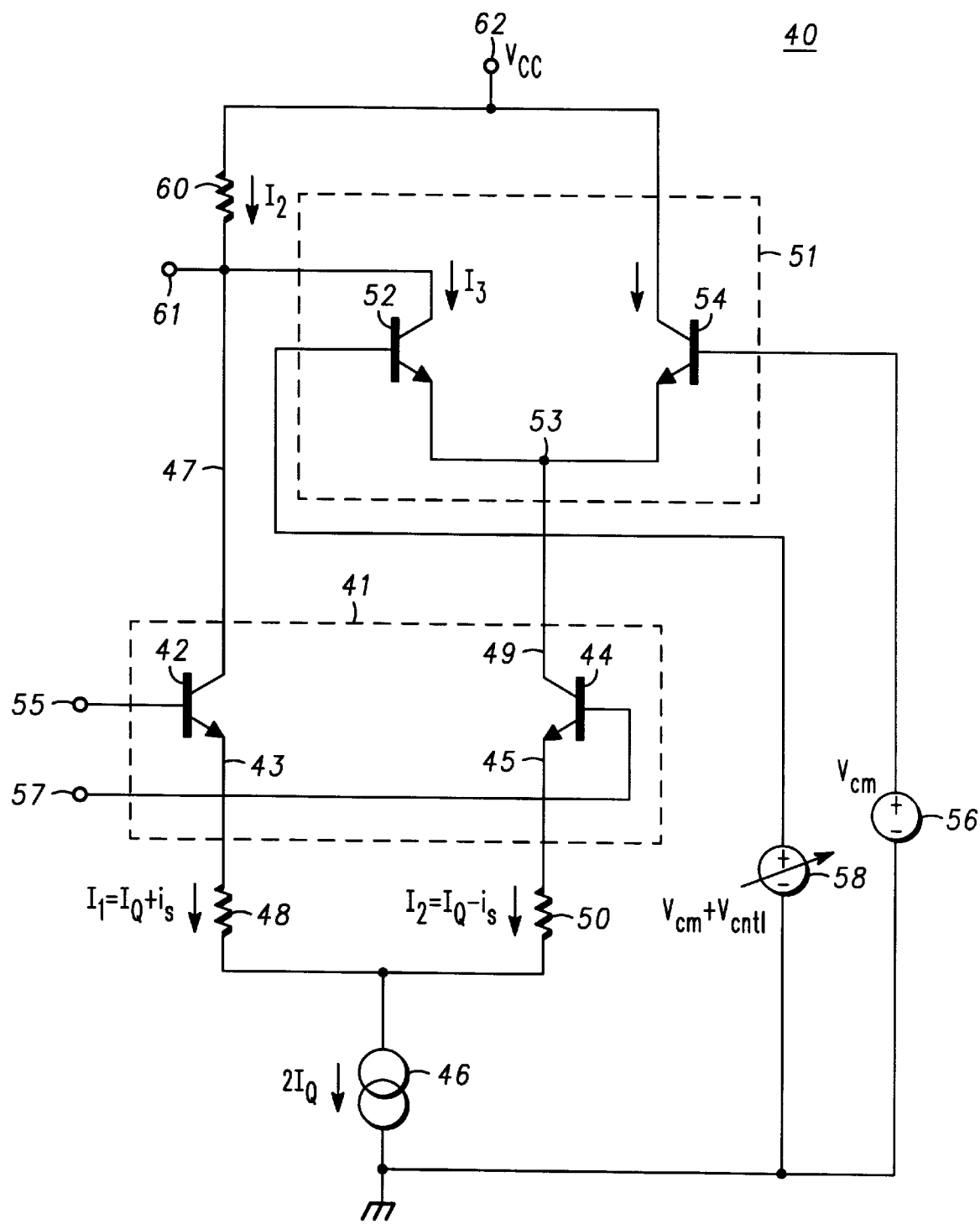
FIG. 2 is a circuit diagram of a variable gain element in accordance with a first embodiment of the present invention.

FIG. 2 is a circuit diagram of a variable gain element 40 in accordance with a first embodiment of the present invention. The variable gain element 40 includes a first differential pair 41 with the emitters 43 and 45 of first transistor 42 and second transistor 44, respectively, coupled through a current source 46 to ground.

To increase the linearity of the variable gain element 40, degeneration resistors 48 and 50 may optionally couple the emitters 43 and 45, respectively, to the current source 46. It will be obvious to those skilled in the art that other forms of degeneration may be employed. For example, inductors may be used in place of resistors to provide RF linearity without incurring a DC voltage drop. Alternatively, separate current sources can individually couple emitters 43 and 45 directly to ground, and a single degeneration resistor then couples emitters 43 and 45 together (again to avoid a DC voltage drop across the degeneration resistance).

The collector 47 of first transistor 42 is coupled to a supply voltage 62 through load resistor 60. A single ended version of the output signal is extracted from the collector 47 at output port 61.

A second differential pair 51 couples the collector 49 of second transistor 44 to both the collector 47 of first transistor 42 and to the supply voltage 62. The second differential pair 51 includes third transistor 52 with its emitter coupled to the emitter of fourth transistor 54 at point. The coupled emitters at point 53 are connected to the collector 49 of second transistor 44. The collector of fourth transistor 54 is coupled to the supply voltage 62, and the collector of third transistor 52 is coupled to the collector 47 of first transistor 42.

A DC reference voltage 56 is applied to the base of fourth transistor 54, and a DC control voltage 58 is applied to the base of third transistor 52. The governing equations for the cancellation of current to control the gain/attenuation of variable gain element 40 is as follows:

$$I_1 = I_Q + I_s \quad (1)$$

$$I_2 = I_Q - i_s \quad (2)$$

$$i_L = I_1 + I_3 \quad (3)$$

$$I_3 = \frac{I_2}{\left(1 + e^{\frac{v_C}{v_T}}\right)} \quad (4)$$

$$i_L = i_s - \frac{i_s}{1 + e^{\frac{v_C}{v_T}}} + I_Q + \frac{i_Q}{1 + e^{\frac{v_C}{v_T}}} \quad (5)$$

where:
- $I_1$ represents the emitter current of first resistor 42,
- $I_Q$ represents the half the quiescent current established by current source 46,
- $I_s$ represents the small signal current,
- $I_2$ represents the emitter current of second transistor 44,
- $I_L$ represents the current passing through load resistor 60,
- $I_3$ represents the emitter current of third transistor 52,
- $v_C$ represents the DC control voltage ($-0.5 \leq V_c \leq 0.5$), and
- $V_T$ represents the thermal voltage (~26 mV at room temperature).

In operation, a differential AC input signal is applied to the input of the first differential pair 41. As shown, the input comprises the base 55 of first transistor 42 and the base 57 of second transistor 44. The variable gain element 40 utilizes signal current cancellation to vary the gain. The signal current is the current produced by the AC input signal (as opposed to the DC quiescent current).

In operation, first transistor 42 and second transistor 44 are biased to conduct at all times (e.g. 360 degree conduction angle). As $V_{cntrl}$ increases to a maximum voltage above $V_{cm}$, third transistor fully conducts while fourth transistor is essentially cut off. Therefore, all of the collector current traveling through second transistor 44 travels through third transistor 52, and the signal current component $I_s$ cancels through load resistor 60. Thus, at maximum attenuation, the current passing through load resistor 60 is substantially $2I_Q$.

As $V_{cntrl}$ decreases, fourth transistor 54 begins to conduct, and the current $I_3$ passing through third transistor 52 decreases. Therefore, there is less small signal current cancellation at load resistor 60 so that the gain increases (attenuation decreases). At the maximum gain/minimum attenuation setting, corresponding to $V_{cntrl} < V_{cm}$, the current passing through load resistor 60 is substantially $I_Q + I_s$. The use of AC coupling can remove the DC current component for all gain settings as is known in the art. Attenuation ranges of 30 to 50 dB can be obtained.

The variable gain element 40 utilizes two less transistors than the prior art variable gain element 10. Therefore, the variable gain element 40 has two less transistors to contribute to both noise and intermodulation power so that noise and intermodulation performance is improved over the prior art.

Figure 3:
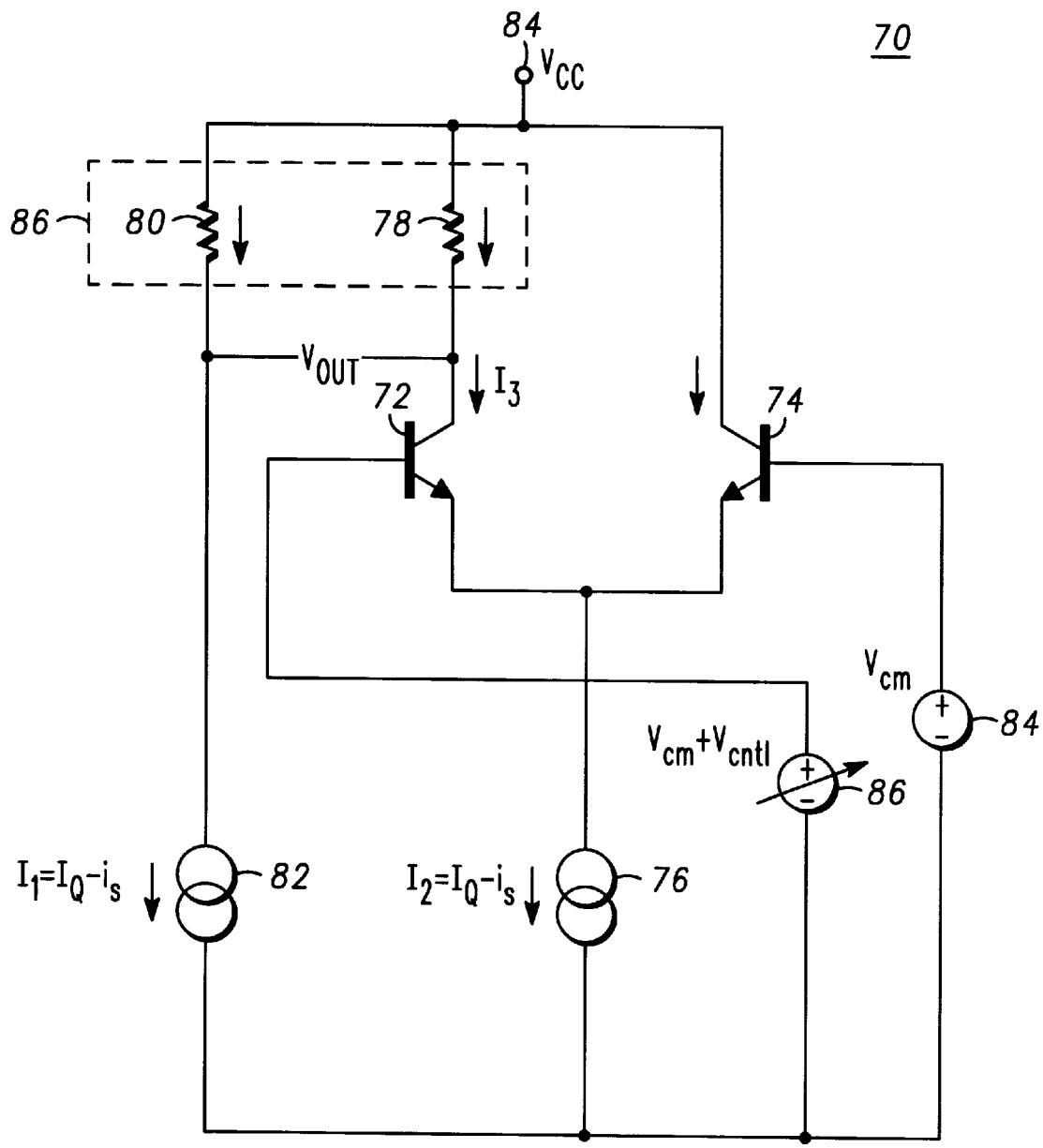
FIG. 3 is a circuit diagram of a variable gain element in accordance with a second embodiment of the present invention.

FIG. 3 is a circuit diagram of a variable gain element 70 in accordance with a second embodiment of the present invention. The variable gain element 70 includes a first differential pair of first transistor 72 and second transistor 74. The emitters are coupled through a first current source 76 to ground. Once again, degeneration in the emitters of first transistor 72 and second transistor 74 can be used to increase the linearity.

First voltage source 86 and second voltage source 84 is shown to have a common mode voltage component $V_{cm}$ to DC bias first transistor 72 and second transistor 74. A control voltage $V_{cntrl}$ component is applied to the base of first transistor 72 to adjust the gain of the variable gain element 70.

The collector of first transistor 72 is coupled to a supply voltage 84 through first load resistor 78. The collector of second transistor 74 is connected directly to the supply voltage 84 or alternatively coupled through a resistor of the same value as first load resistor 78. A second load resistor 80 is coupled from the supply voltage 84 to ground through second current source 82.

In the illustrated embodiment, the actual input signal is applied to the variable gain element 70 by current coupling the input signal to first current source 76 and second current source 82. This can be accomplished through the use of conventional current mirror circuitry as is known in the art.

When first transistor 72 is biased fully on by $V_{cntrl}$, all of current $I_2$ passes through first transistor 72 and first load resistor 78. Since the signal current is is mapped both to first current source 76 and second current source 82, the differential voltage drop across the load 86 is substantially zero. Conversely, when second transistor 74 is fully conducting, most of current 12 passes is directed through second transistor 74 so that there is negligible current drop across first load resistor 78. Therefore, the differential output voltage is proportional to the second load resistance times the current $I_1$.

The previous description of the preferred embodiments are provided to enable any person skilled in the art to practice the preferred embodiments. Various modifications to these embodiments will be readily apparent to those skilled in the art, and the generic principles defined herein may be applied to other embodiments without the use of the inventive faculty. For example, the preferred embodiments have been described with the use of bipolar junction transistors (BJTs). The embodiments are equally applicable with the use of field effect transistors (FETs). The base terminal of the BJT corresponds to the gate terminal of the FET, the collector terminal of the BJT corresponds to the drain terminal of the FET, and the emitter terminal of the BJT corresponds to the source terminal of the FET.

In addition, the loads can comprise elements other than resistors. For example, inductive loads can be utilized.

We claim:

1. A voltage controlled variable gain element comprising:
   a first bipolar junction transistor (BJT) having an emitter terminal, a base terminal, and a collector terminal;
   a second BJT having an emitter terminal, a base terminal, and a collector terminal, the emitter terminal of the second BJT coupled to the emitter terminal of the first BJT to form a common node, the collector terminal of the second BJT coupled to a supply voltage;

a first current source coupling the common node to a ground potential, the first current source including a current component representative of an input signal;

a first load element coupling the supply voltage to the collector terminal of the first BJT to form a first output;

a second current source coupled to ground, the second current source including the current component representative of the input signal;

a variable control voltage source coupled to at least one of the base terminal of the first BJT and a base terminal of the second BJT, the variable control voltage source being varied to change the gain of the variable gain element; and a second load element coupling the supply voltage to the second current source to form a second output terminal.

2. The variable gain element as in claim 1 wherein the first load element and the second load element comprise resistors.

3. The variable gain element as in claim 1 further comprising a collector resistor coupled between the collector terminal of the second BJT and the supply voltage.

4. A variable gain element comprising:

a first field effect transistor (FET) having an source terminal, a gate terminal, and a drain terminal;

a second FET having a source terminal, a gate terminal, and a drain terminal, the source terminal of the second FET coupled to the source terminal of the first FET to form a common node, the drain terminal of the second FET coupled to a supply voltage;

a first current source coupling the common node to a ground potential, the first current source including a current component representative of an input signal;

a first load element coupling the supply voltage to the drain terminal of the first FET to form a first output;

a second current source coupled to ground, the second current source including the current component representative of the input signal; and a second load element coupling the supply voltage to the second current source to form a second output terminal.

5. A variable gain element comprising:

a differential transistor pair including a first transistor and a second transistor;

a first current source coupling a common node between the first transistor and the second transistor to a ground potential, the first current source containing an information signal component;

a first load coupling an output terminal of the first transistor to a supply voltage, the output terminal of the first transistor forming a first output terminal;

a second load coupled to the supply voltage; and a second current source coupling the second load to the ground potential, wherein a node at the junction of the second load and the second current source forms a second output terminal, the second current source containing the information signal component.

6. The variable gain element as in claim 5, further comprsing a variable voltage source coupled to at least one input terminal of the differential transistor pair, wherein altering the voltage of the variable voltage source adjusts the gain of the variable gain element to change the magnitude of an output signal appearing at the first and the second output terminals responsive to the input information signal components.

7. The variable gain element as in claim 6 wherein the first load and the second load comprise resistors.

8. The variable gain element as in claim 6 wherein the first transistor and the second transistor comprise bipolar transistors.

9. The variable gain element as in claim 6 wherein the first transistor and the second transistor comprise field effect transistors.

* * * * *

UNITED STATES PATENT AND TRADEMARK OFFICE
CERTIFICATE OF CORRECTION

PATENT NO. : 6,452,445 B1
DATED : September 17, 2002
INVENTOR(S) : Nobbe et al.

It is certified that error appears in the above-identified patent and that said Letters Patent is hereby corrected as shown below:

Column 6,
Line 22, change "comprsing" to -- comprising --

Signed and Sealed this

Twenty-eighth Day of January, 2003

JAMES E. ROGAN
*Director of the United States Patent and Trademark Office*